United States Patent
Van Den Brink et al.

(10) Patent No.: US 11,675,038 B2
(45) Date of Patent: Jun. 13, 2023

(54) DIFFUSION MR IMAGING WITH FAT SUPPRESSION

(71) Applicant: KONINKLIJKE PHILIPS N.V., Eindhoven (NL)

(72) Inventors: Johan Samuel Van Den Brink, Metern (NL); Elwin De Weerdt, Tilburg (NL)

(73) Assignee: Koninklijke Philips N.V., Eindhoven (NL)

( * ) Notice: Subject to any disclaimer, the term of this patent is extended or adjusted under 35 U.S.C. 154(b) by 277 days.

(21) Appl. No.: 16/771,385

(22) PCT Filed: Dec. 4, 2018

(86) PCT No.: PCT/EP2018/083392
§ 371 (c)(1),
(2) Date: Jun. 10, 2020

(87) PCT Pub. No.: WO2019/115277
PCT Pub. Date: Jun. 20, 2019

(65) Prior Publication Data
US 2021/0173033 A1 Jun. 10, 2021

(30) Foreign Application Priority Data
Dec. 11, 2017 (EP) .................................... 17206405

(51) Int. Cl.
*G01R 33/56* (2006.01)
*G01R 33/385* (2006.01)
(Continued)

(52) U.S. Cl.
CPC ..... *G01R 33/5607* (2013.01); *G01R 33/3852* (2013.01); *G01R 33/4828* (2013.01);
(Continued)

(58) Field of Classification Search
CPC .......... G01R 33/56341; G01R 33/5607; G01R 33/3852; G01R 33/4828; G01R 33/5611;
(Continued)

(56) References Cited

U.S. PATENT DOCUMENTS 5,270,654 A * 12/1993 Feinberg ............ G01R 33/5615
324/309
5,560,360 A * 10/1996 Filler ................ G01R 33/56341
600/408
(Continued)

FOREIGN PATENT DOCUMENTS

JP 2010042245 A * 2/2010 ............. A61B 5/055

OTHER PUBLICATIONS

Burakiewicz et al. "Water-fat separation in diffusion-weighted EPI using an IDEAL approach with image navigator", Magnetic Resonance in Medicine., vol. 73, No. 3, Apr. 10, 2014 (Apr. 10, 2014), pp. 964-972.
(Continued)

*Primary Examiner* — Patrick Assouad
*Assistant Examiner* — Demetrius R Pretlow

(57) ABSTRACT

A fat suppressed diffusion image determination apparatus, a corresponding method and a corresponding computer program determine a diffusion weighted magnetic resonance image (DWI) of an object. The fat suppressed diffusion image determination apparatus includes a diffusion reference image providing unit for providing a diffusion reference MR image of the object, a fat image determination unit for determining a fat image from the diffusion reference MR image, a diffusion weighted image providing unit for providing a diffusion weighted MR image of the object, a fat suppressed image determination unit for determining a fat suppressed diffusion weighted MR image using a combination of the diffusion weighted MR image and the fat image.

20 Claims, 2 Drawing Sheets

(51) Int. Cl.
*G01R 33/48* (2006.01)
*G01R 33/561* (2006.01)
*G01R 33/563* (2006.01)
*G06T 5/50* (2006.01)

(52) U.S. Cl.
CPC ...... *G01R 33/5611* (2013.01); *G01R 33/5616* (2013.01); *G01R 33/56341* (2013.01); *G06T 5/50* (2013.01); *G06T 2207/10092* (2013.01); *G06T 2207/20224* (2013.01); *G06T 2207/30004* (2013.01)

(58) Field of Classification Search
CPC .................. G01R 33/5616; G06T 5/50; G06T 2207/20224; G06T 2207/30004
See application file for complete search history.

(56) References Cited

U.S. PATENT DOCUMENTS

| | | | | |
|---|---|---|---|---|
| 5,706,813 | A * | 1/1998 | Filler | G01R 33/385 324/318 |
| 6,177,795 | B1 * | 1/2001 | Zhu | G01R 33/4828 324/309 |
| 10,338,178 | B2 * | 7/2019 | Liang | G01R 33/485 |
| 2005/0036944 | A1 * | 2/2005 | Van Den Brink | G01R 33/3415 424/9.3 |
| 2005/0212517 | A1 * | 9/2005 | Jaermann | G01R 33/5611 324/307 |
| 2006/0001424 | A1 * | 1/2006 | Harvey | G01R 33/56341 324/309 |
| 2008/0157767 | A1 * | 7/2008 | Bammer | G01R 33/4824 382/128 |
| 2009/0035218 | A1 * | 2/2009 | Ross | A61B 5/4504 424/9.1 |
| 2009/0299172 | A1 * | 12/2009 | Corot | A61B 5/415 600/420 |
| 2012/0112743 | A1 * | 5/2012 | Granlund | G01R 33/5614 324/309 |
| 2016/0231409 | A1 * | 8/2016 | Taviani | G01R 33/5611 |
| 2017/0030986 | A1 * | 2/2017 | James | G01R 33/4835 |
| 2017/0261584 | A1 * | 9/2017 | James | A61B 5/055 |
| 2017/0293008 | A1 * | 10/2017 | Qin | G01R 33/5607 |
| 2018/0140218 | A1 * | 5/2018 | Heberlein | G01R 33/50 |
| 2019/0056470 | A1 * | 2/2019 | Wang | A61B 5/055 |
| 2019/0162807 | A1 * | 5/2019 | Zahneisen | G01R 33/5608 |
| 2022/0011390 | A1 * | 1/2022 | Heberlein | G01R 33/543 |

OTHER PUBLICATIONS

D J Larkman et al: "Water and Fat Separation using Standard SENSE Processing", Proceedings of the International Society for Magnetic Resonance in Medicine, 13th Annual Meeting and Exhibition, Miami Beach, Florida, USA, May 7-13, 2005, vol. 13, Apr. 23, 2005 (Apr. 23, 2005), pp. 505.

Burakiewizc et al. "Improved olefinic fat suppression in skeletal muscle DTI using a magnitude-based dixon method" Magnetic Resonance in Med. Vo.. 79, No. 1 Mar. 5, 2017 p. 152-159.

Le Bihan et al. MR Imaging of Intravoxel Incoherent Motions, Application to Diffusion and Perfusion in Neuropligic Disorders, Radiology 161 p. 401-407 (1986).

Larkman et al. "Parallel Magnetic Resonance Imaging" Phys. Med. Biol. 52 (2007) R 15-R55.

Pruessmann et al. "SENSE: Sensitivity Encoding for fast MRI" Magn. Reson. Med. 1999 42 p. 952-962.

Stejskal et al. "Spin Diffusion Measurements: Spin Echos in the Presence of Time Dependent Field Gradient" J. Chem. Phys. 1965 42 (1) p. 288-292.

Burakiewicz et al. "Improved Olefinic fat Suppression in Skeletal Muscle DTI Using a Magnitude based Dixon Method" Magnetic Reson. in Med. Vo. 79, No. 1 Mar. 5, 2017 p. 152-159.

Ni et al: "Technical advancements and protocol optimization of diffusion-weighted imaging (DWI) in liver", Abdominal Radiology, Springer US, New York,vol. 41, No. 1,Jan. 4, 2016 (Jan. 4, 2016), pp. 189-202.

Peter Bendel et al.: "A method for fat suppression in MRI based on diffusion-weighted imaging;Fat suppression by diffusion-weighted MRI",Physics in Medicine and Biology, Institute of Physics Publishing, Bristol GB,vol. 55, No. 22, Nov. 3, 2010 (Nov. 3, 2010), pp. N547-N555.

Search Report from PCT/EP2018/083392 dated Mar. 25, 2019.

* cited by examiner

DIFFUSION MR IMAGING WITH FAT SUPPRESSION

CROSS REFERENCE TO RELATED APPLICATIONS

This application is a U.S. national phase application of International Application No. PCT/EP2018/083392 filed on Dec. 4, 2018, which claims the benefit of EP Application Serial No. 17206405.7 filed on Dec. 11, 2017 and is incorporated herein by reference.

FIELD OF THE INVENTION

The invention relates to the field of magnetic resonance (MR) imaging. It concerns a fat suppressed diffusion image determination apparatus and a corresponding method for determining a diffusion weighted magnetic resonance image (DWI) of an object. The invention also relates to a MRI system and to a computer program to be run on the fat suppressed diffusion image determination apparatus.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

Diffusion-weighted MRI (DWI) has been adopted widely in clinical practice, for instance to improve the detection of malignancy for a wide variety of cancers. Fat suppression is an essential ingredient in DWI as the pixel-wise apparent diffusion coefficient (ADC) is a correlate for pathology, in particular the grading of cancer. Relative to water, the diffusivity of fat is extremely low and any residual signal will confound the assessment of the ADC of the calculation or computed DWI (cDWI) images.

One approach to fat suppression in diffusion MRI is to exploit the chemical shift between fat and water using spectrally-selective pulses such as used in SPectral Attenuated Inversion Recovery (SPAIR) or by application of a selective inversion-recovery pulse scheme such as Short-TI Inversion Recovery (STIR) as known in the art. These schemes are possibly augmented by inverted slice-select gradients for the 90°-180° pulse pair to shift residual fat out of the spectral refocusing band.

Each of these methods come with a loss of signal to noise ratio (SNR), which is inherently low in DWI. Also, the fat signal is composed of multiple spectral peaks, primarily at 3.5 ppm and at 1 ppm, wherein 1 ppm is too close to the water line to be suppressed by spectrally-selective excitation.

In other imaging sequences apart from diffusion imaging, algorithmic separation of water and fat signals such as the DIXON algorithm has developed as an alternative to spectral fat suppression. However, it is difficult to apply the multi-echo time DIXON algorithm to diffusion imaging, why alternative methods are needed.

Burakiewicz et al. (DOI: 10.1002/mrm.25191, 2014) disclose the potential of DIXON DWI with multiple echo-time shifted single shot echo planar imaging (EPI) acquired images. This method comes at the expense of a longer echo time which thereby leads to a further reduced SNR. Further, the publication showed to require a phase navigator to ensure that the two or three acquisitions at different echo times can be related to the same phase since the phase in DWI is extremely sensitive to deviations from the motion encoding during the diffusion gradients. Further, the single-shot acquisitions are replaced by multiple acquisitions at each value of the diffusion parameter (b-value) which increases the scan time by a factor of up to 3.

Larkman et al. (ISMRM 2005, 505) disclose the application of SENSitivity Encoding (SENSE) to generate water and fat resolved images based on a single shot EPI diffusion weighted image. However, the scheme is described as, while being effective, not being optimal as all pixels are considered to be two fold degenerate independent of the presence of fat or not. Thus, a degeneration of the SNR across the whole image due to g-factor effects is experienced even at low SENSE reduction factors. Thus, the method is not compatible with high SENSE factors which are normally required for geometrically-accurate EPI.

Magnetic resonance in medicine, vol 79, no. 1, 5 Mar. 2017, pages 152-159 discloses an improved olefinic fat suppression in skeletal muscle DTI using a magnitude-based dixon method.

SUMMARY OF THE INVENTION

It has thus been an object of the present invention to provide a fat suppressed diffusion image determination apparatus, a corresponding fat suppressed diffusion image determination method, a MR imaging system and corresponding computer program that allow for a robust fat suppression in diffusion MRI with improved SNR and scan time trade-off.

In a first aspect of the invention, a fat suppressed diffusion image determination apparatus for determining a diffusion weighted magnetic resonance image (DWI) of an object is provided. The fat suppressed diffusion image determination apparatus comprises:
 a diffusion reference image providing unit for providing a diffusion reference MR image of the object,
 a fat image determination unit for determining a fat image from the diffusion reference MR image,
 a diffusion weighted image providing unit for providing a diffusion weighted MR image of the object,
 a fat suppressed image determination unit for determining a fat suppressed diffusion weighted MR image using a combination of the diffusion weighted MR image and the fat image.

Since the fat suppressed diffusion weighted MR image is determined based on the fat image, which itself is determined based on a different image, namely the diffusion reference MR image, no additional fat image acquisitions for the diffusion weighted MR image are necessary. Thus, the fat suppressed diffusion image determination apparatus according to the invention allows to determine the fat suppressed diffusion weighted MR image without deteriorated SNR, even if, for instance, high SENSE reduction factors required for geometrically accurate EPI are employed.

The fat image can be data provided in image space. However, the fat image is not limited to values or data in image space and can also be represented in, for instance, k-space.

The invention is based on the finding that the separation of water and fat is independent of the diffusion encoding and that further, since mobility of fat may generally be neglected, the fat signals, i.e. the fat image, is independent from the diffusion encoding. Thus, the fat contributions can be eliminated from the diffusion weighted MR image by considering the fat image determined based on the diffusion reference MR image.

Further, since no additional fat acquisitions are required for determining the diffusion weighted MR image, scan time is not increased for obtaining the diffusion weighted MR image.

The object is preferentially a living being, i.e. a person or an animal, or a part of the living being such as an organ like the liver, the brain, the heart, the lung, the pancreas, the kidney, et cetera. The object can also be a technical object in which diffusion occurs.

The diffusion reference image providing unit can be a storage in which the diffusion reference image data are stored and from which the diffusion reference MR image data can be retrieved for providing the same. The diffusion reference image providing unit can also be a receiving unit for receiving the diffusion reference image data and to provide the received diffusion reference image data. For instance, the diffusion reference image providing unit can be adapted to receive the diffusion reference image data from an MR data acquisition device in a raw or processed form, i.e. in the form of a reconstructed MR image. The diffusion reference image providing unit can also be a MR data acquisition device of a MR imaging system.

Likewise, the diffusion weighted image providing unit can be a storage in which the diffusion weighted image data are stored and from which the diffusion weighted image data can be retrieved for providing the same. The diffusion weighted image providing unit can also be a receiving unit for receiving the diffusion weighted image data and to provide the received diffusion weighted image data. For instance, the diffusion weighted image providing unit can be adapted to receive the diffusion weighted image data from an MR data acquisition device in a raw or processed form, i.e. in the form of a reconstructed MR image. The diffusion weighted image providing unit can also be a MR data acquisition device of a MR imaging system.

Preferentially, the diffusion reference MR image originates from a MR image acquisition with no or insignificant diffusion weighting. More preferably, a diffusion parameter which is indicative of strength and duration of the diffusion gradients is significantly lower for the diffusion reference MR image than for the diffusion weighted MR image. The diffusion parameter is preferably the b-value described in, for instance, Le Bihan et al. "MR imaging of intravoxel incoherent motions; application to diffusion and Perfusion in neurologic disorders.", Radiology. 161: 401-407 (1986).

The diffusion reference MR image preferentially comprises raw acquired data, for instance in k-space, partly reconstructed image data, e.g. an aliased or folded image in case of parallel MRI, and/or the fully reconstructed image data. Preferably, the diffusion reference MR image acquisition timing is identical with the timing for the diffusion weighted MR image acquisition, with the diffusion-encoding parameter b set to zero by applying zero gradient area for the diffusion-encoding gradients, or a b-value near zero, i.e. a relatively low b-value. In the following, the terms diffusion reference MR image and non-diffusion weighted MR image will be used synonymously, wherein a non-diffusion weighted MR image includes MR images with low or insignificant diffusion weighting, as exemplified above.

Contrary to the diffusion reference MR image, the diffusion weighted MR image originates from a MR image acquisition having the diffusion parameter b significantly larger than 0, for instance 100 or 1000 s/mm$^2$, wherein this b-values are of course exemplary and not limiting. Also the diffusion weighted MR image can comprise raw acquired data, for instance in k-space, partly reconstructed image data, e.g. an aliased or folded image in case of parallel MRI, and/or the fully reconstructed image data.

In a preferred embodiment of the fat suppressed diffusion image determination apparatus, the diffusion reference image providing unit is configured to provide the diffusion reference MR image acquired with a diffusion parameter of at most 200 s/mm$^2$, preferably at most 100 s/mm$^2$, and most preferably at most 50 s/mm$^2$. The diffusion parameter not exceeding these limits has the advantageous effect to efficiently suppress flow effects.

In a further preferred embodiment of the fat suppressed diffusion image determination apparatus, a difference between the b-values of the diffusion reference MR image and the diffusion weighted MR image acquired is at least 100 s/mm$^2$. However, the inventive concept can be advantageously applied to significantly larger differences in b-values, such as in the range of 500 s/mm$^2$, 1000 s/mm$^2$, 2000 s/mm$^2$ or more.

In a preferred embodiment of the fat suppressed diffusion image determination apparatus, the diffusion weighted image providing unit is configured to provide a plurality of diffusion weighted MR images of the object with respective different diffusion parameters, wherein the fat suppressed image determination unit is configured to provide a plurality of fat suppressed diffusion weighted MR images for each of the plurality of diffusion weighted MR images using the fat image.

Advantageously, only one fat image is required, wherein this fat image is used for determining multiple fat suppressed diffusion weighted MR images having different diffusion encoding factors (b values). Accordingly, the acquisition time can advantageously be reduced, leading to a shorter scan time. Even if the diffusion reference image, which is used for determining the fat image, is acquired having a longer scan time, the overall scan time will be reduced since the increase of scan time only applies to the diffusion reference MR image, while a plurality of the images, i.e. the diffusion weighted MR images, are acquired without the increased scan time.

In a preferred embodiment of the fat suppressed diffusion image determination apparatus, the diffusion reference image providing unit and the diffusion weighted image providing unit are configured to provide the MR images using a parallel imaging method, respectively.

Parallel imaging methods are known in the art and include the concepts of having multiple coils, which each have a different sensitivity to different regions of the image space. The use of multiple receiver coils has reduced acquisition times significantly. An overview over parallel magnetic resonance imaging techniques can be found in, for instance, Larkman et al. "Parallel magnetic resonance imaging" Phys. Med. Biol. 52 (2007) R15-R55. In particular in diffusion MR imaging, parallel imaging ensures the echo time to be short enough to yield valuable SNR signals.

In a preferred embodiment of the fat suppressed diffusion image determination apparatus, the parallel imaging method comprises at least SENSE.

SENSE is known, for instance, from Pruessmann et al. "SENSE: Sensitivity encoding for fast MRI." Magn. Reson. Med. 1999; 42:952-962, in addition to the review on parallel MR imaging cited above. The exemplary parallel imaging techniques of this embodiment are primarily performed in image space after reconstruction of data from the individual coils. Other approaches including GRAPPA/ARC methods operate primarily on k-space data before image reconstruction and are also contemplated to be employed in the alternative. Further, it is clear that every known and feasible modification to the parallel imaging methods described above are likewise contemplated.

In the particularly preferred embodiment of SENSE, for instance, the reconstructed image data of the different coils shows aliasing, i.e. is folded, and is to be unfolded before the final image is obtained, which is precisely performed by the SENSE algorithm.

In a preferred embodiment of the fat suppressed diffusion image determination apparatus, the diffusion reference image providing unit is configured to provide a folded representation of the diffusion reference MR image of the object, wherein the fat image determination unit is configured to determine an unfolded fat image by decomposing fat and water from the representation of the diffusion reference MR image, and to determine a folded representation of the fat signals as the fat image.

Preferentially, the fat image can then be subtracted from the folded representation of the diffusion weighted MR image, i.e. the image after transformation from k-space but before reconstruction. The decomposition can be done in a known way based on, for instance, an a priori known chemical shift induced displacement between fat and water. Water and fat separation in EPI is known from, for instance, Larkman et al. Proc. Intl. Soc. Mag. Reson. Med. 13 (2005) 505.

In a preferred embodiment of the fat suppressed diffusion image determination apparatus, the fat image determination unit is configured to determine a complex valued fat image and the diffusion reference image providing unit is configured to provide a complex valued diffusion reference MR image. Additionally or alternatively, also the diffusion weighted image providing unit can provide the fat suppressed diffusion weighted MR image complex valued. In particular, the provision of the MR images preferentially comprises a complex value EPI reconstruction.

Further preferentially, both the folded or SENSE reduced representation of the diffusion reference MR image and the unfolded fat image are provided as complex valued image data, which provide phase information.

In a preferred embodiment of the fat suppressed diffusion image determination apparatus, the diffusion reference image providing unit is configured to provide the diffusion reference MR image using multiple shots for covering the entire k-space, wherein the multiple shots have similar k-space trajectories, respectively, wherein the k-space trajectories of the multiple shots have a respectively different shift in phase encoding direction.

In contrast to single shot acquisition, k-space is traversed in this embodiment using a plurality of radio frequency (RF) excitation pulses. The k-space trajectories of the multiple shots of the diffusion reference image correspond preferentially to the k-space trajectories covered by the diffusion weighted MR image in order to assure that the geometric deformation in each shot is the same.

In a preferred embodiment of the fat suppressed diffusion image determination apparatus, the diffusion reference image providing unit is configured to perform a multi-shot acquisition for the diffusion reference MR image. The multi-shot acquisition provides a better conditioning of the reconstruction problem and thus at least partially alleviates the need to resolve the aliasing due to undersampling for the reconstruction of the diffusion reference MR image, with its real and imaginary signal components.

In a preferred embodiment of the fat suppressed diffusion image determination apparatus, the diffusion reference image providing unit is thus configured to perform an echo planar imaging (EPI) reconstruction to complex valued image data.

This complex valued diffusion reference MR image data is the input for a SENSE reconstruction to derive the diffusion suppressed water image and the fat image. This alleviates the need for multi echo time (TE) acquisitions.

In a preferred embodiment of the fat suppressed diffusion image determination apparatus, the fat image determination unit is configured to determine the fat image using a SENSE separation of water and fat using the EPI reconstructed complex valued image data.

The SENSE separation of water and fat is known from Larkman et al. cited above. However, the SENSE separation is of course only one suitable method for water and fat separation while other separation algorithms known in the art can be employed instead.

In a preferred embodiment of the fat suppressed diffusion image determination apparatus, the diffusion reference image providing unit is configured to provide the diffusion reference image with a particular SENSE reduction factor.

In this respect, it should be ensured that geometric distortion be the same for each shot of a multi-shot acquisition. In essence, this condition can be met by ensuring a constant ratio of a difference between two adjacent lines in k-space to the echo spacing, i.e. the distance in time between subsequent echoes.

In a preferred example, the sampled field of view (FOV) and the SENSE reduction factor can be increased through multiplying with factors, until the resulting SENSE factor is an integer. However, also other options to meeting the constant geometric distortion requirement are of course feasible.

To provide a further example, the diffusion reference MR image acquisition can be configured to have a number of shots Ns equal to a SENSE reduction factor R of the diffusion weighted MR image acquisition or corresponding to the nearest integer larger than the reduction factor R, which can be expressed as Ns=ceil(R).

Since the difference or delta between lines in k space must be identical for a SENSE reduced shot and for the multi-shot acquisition in order to keep the distortions identical, less k-space lines per shot are needed to cover the same field of view in case the number of shots has been rounded up, as will be described in the following. The number of phase encoded k-space lines for a SENSE encoded shot or acquisition can be defined as Nk(SENSE)=N/R, i.e. a ratio of an image resolution or number of non-reduced phase encoded k-space lines N to the reduction factor R.

The image resolution N is the same for the multi-shot acquisition with Ns shots, which leads to a number of k-spaces lines per shot Nk(per shot)=N/Ns, which is smaller or equal to the number of k-spaces lines for the SENSE reduced shot Nk(SENSE). Thus, keeping the EPI train timing identical, also non-integer reduction factors R for the MR image acquisitions can be implemented by increasing the number of shots in the diffusion reference MR image acquisition.

It will be appreciated that applying water/fat separation in reconstruction, generally doubles the number of unknowns which, in particular in a SENSE-undersampled image, e.g. the diffusion reference MR image, results in a more prominent g-factor penalty. To alleviate this penalty, a better determined reconstruction is preferentially ensured. In an embodiment, the reconstruction can be additionally conditioned by integrating a regularization parameter, which is capable of indicating where the fat and/or water is.

In a preferred embodiment of the fat suppressed diffusion image determination apparatus, the fat image determination unit is configured to add multiple averages of the diffusion reference image to the fat image.

In this embodiment, it is assumed that the SENSE reconstruction problem is sufficiently well-conditioned, i.e. that the g-factor is sufficiently low. The multiple averages, which can be in the range of 1 to 5 or more, will then be sufficient to address about a 10-20% signal to noise ratio (SNR) loss due to an increased g-factor penalty. Advantageously, this approach of adding a few averages can provide a reasonable estimate of the fat signal, i.e. the fat image, while being simple to implement.

In a preferred embodiment of the fat suppressed diffusion image determination apparatus, the diffusion weighted image providing unit is configured to provide the diffusion weighted MR image before unfolding, wherein the fat suppressed image determination unit is configured to subtract the folded fat image from the folded diffusion weighted MR image and to determine the fat suppressed diffusion weighted MR image by unfolding the fat image subtracted folded diffusion weighted MR image.

Since the fat suppressed diffusion weighted MR image is unfolded in the form of a water only processing, i.e. after the fat image has been subtracted from the folded diffusion weighted MR image, ill-conditioning of the reconstruction problem is prevented. In addition, no need for a phase navigator or the like arises since a single acquisition at each value of the diffusion parameter b is sufficient and no need exists to particularly consider the phase in diffusion-weighted imaging, which is extremely sensitive to deviations from the motion encoding during the diffusion gradients.

In a further aspect of the invention, a magnetic resonance imaging (MRI) system for imaging an object is provided. The MRI system comprises a MR imaging apparatus configured to acquire a diffusion reference MR image and a diffusion weighted MR image of the object, and a fat suppressed diffusion image determination apparatus according to claim 1.

Advantageously, the MRI system according to this aspect allows the determination of a diffusion weighted image (DWI) with the same advantages as described with reference to the fat suppressed diffusion image determination apparatus above. Likewise, all preferred embodiments of the fat suppressed diffusion image determination apparatus can be combined with the MRI system according to this aspect.

Preferentially, the diffusion reference image providing unit and the diffusion weighted image providing unit of the fat suppressed diffusion image determination apparatus are configured to provide the diffusion reference MR image and the diffusion weighted MR image, respectively, acquired by the MR imaging apparatus.

Preferentially, the MRI system comprises a processing unit such as a host computer wherein one, more or all of the units of the fat suppressed diffusion image determination apparatus are realized as units of hard- and/or software included in the host computer. Additionally or alternatively, one, more or all of the units of the fat suppressed diffusion image determination apparatus can be implemented remote from the MR imaging apparatus, such as at a remote server.

In a further aspect of the invention, a fat suppressed diffusion image determination method for determining a diffusion weighted magnetic resonance image (DWI) of an object is provided. The fat suppressed diffusion image determination method comprises:

providing a diffusion reference MR image of the object, determining a fat image from the diffusion reference MR image, providing a diffusion weighted MR image of the object, determining a fat suppressed diffusion weighted MR image using a combination of the diffusion weighted MR image and the fat image In a further aspect of the invention, a computer program for controlling a fat suppressed diffusion image determination apparatus as defined in claim 1 is provided. The computer program comprises program code means for causing the fat suppressed diffusion image determination apparatus to carry out the fat suppressed diffusion image determination method as defined in claim 14, when the computer program is run on the magnetic resonance imaging apparatus.

It shall be understood that the fat suppressed diffusion image determination apparatus of claim 1, the magnetic resonance imaging system of claim 13, the fat suppressed diffusion image determination method of claim 14, and the computer program of claim 15, have similar and/or identical preferred embodiments, in particular, as defined in the dependent claims.

It shall be understood that a preferred embodiment of the present invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Figure 1:
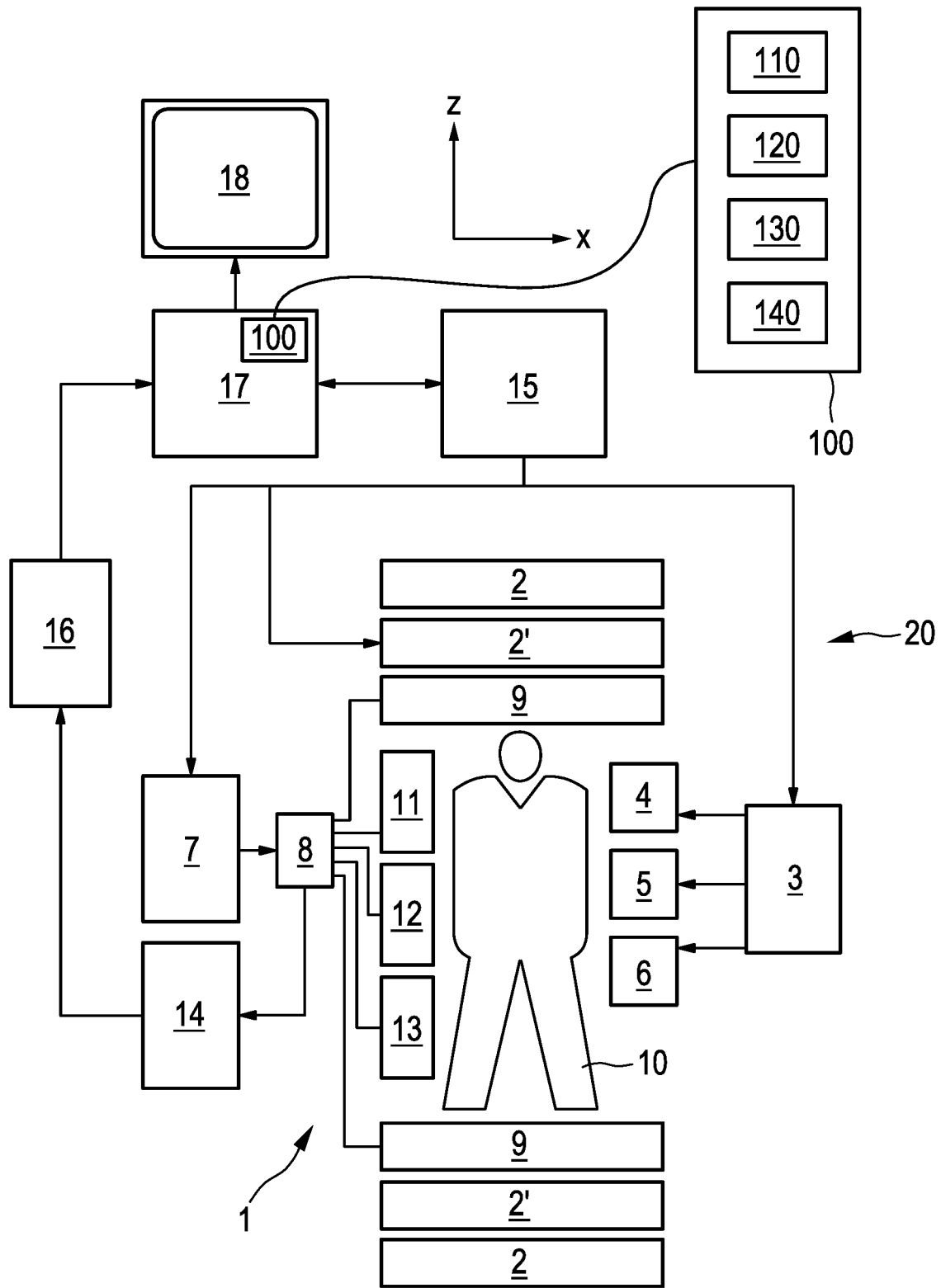
FIG. 1 shows schematically and exemplarily a MR imaging system comprising the fat suppressed diffusion image determination apparatus according to the invention.

According to the MR method in general, the body of the patient to be examined is arranged in a strong, uniform magnetic field $B_0$ whose direction at the same time defines an axis (normally the z-axis) of the coordinate system to which the measurement is related. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency).

From a macroscopic point of view, the distribution of the individual nuclear spins produces an overall magnetization which can be deflected out of the state of equilibrium by application of an electromagnetic pulse of appropriate frequency (RF pulse) while the corresponding magnetic field $B_1$ of this RF pulse extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the magnetization is deflected from the z axis to the transverse plane (flip angle 90°). The transverse magnetization and its variation can be detected by means of receiving RF coils which are arranged and oriented within an examination volume of the MR device in such a manner that the variation of the magnetization is measured in the direction perpendicular to the z-axis.

In order to realize spatial resolution in the body, constant magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body.

The signal data obtained via the receiving coils correspond to the spatial frequency domain and are called k-space data. The k-space data usually include multiple acquired k-space profiles (lines in k-space) of different phase encoding. Each k-space profile is digitized by collecting a number of samples. A set of k-space data is converted to an MR image by means of Fourier transformation.

To sensitize MRI images to diffusion, instead of a homogeneous magnetic field, the homogeneity is varied linearly by a pulsed field gradient. Since precession is proportional to the magnet strength, the protons begin to precess at different rates, resulting in dispersion of the phase and signal loss. Another gradient pulse is applied after some time in the same magnitude but with opposite direction to refocus or rephase the spins. The refocusing will not be perfect for protons that have moved during the time interval between the pulses, due to the variation of magnitude of the pulse between previous and current position of the proton, and the signal measured by the MRI machine is reduced.

With reference to FIG. 1, a MR imaging system 20 comprising a MR imaging apparatus 1 is shown. The apparatus comprises superconducting or resistive main magnet coils 2 such that a substantially uniform, temporally constant main magnetic field $B_0$ is created along a z-axis through an examination volume. The device further comprises a set of (1st, 2nd, and—where applicable—3rd order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient amplifier 3 applies current pulses or waveforms to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance signals. The RF pulses are used to saturate, excite resonance, invert magnetization, refocus resonance, or manipulate resonance and select a portion of a body as an example of an object 10 positioned in the examination volume. The MR signals are also picked up by the body RF coil 9.

For generation of MR images of limited regions of the object 10 or for scan acceleration by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send/receive switch 8.

A host computer 15 controls the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE or GRAPPA in the field of parallel imaging. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

In the MR imaging system 20 shown in FIG. 1, the system further includes a fat suppressed diffusion image determination apparatus 100 according to an aspect of the present invention. The fat suppressed diffusion image determination apparatus 100 is configured to determine a diffusion weighted magnetic resonance image (DWI) of the object 10. The fat suppressed diffusion image determination apparatus 100 thus implements a specific method of reconstructing an MR image, in particular a DWI with efficient fat suppression.

Fat suppressed diffusion image determination apparatus 100 is in this example, shown as integrated into the reconstruction processor 17 and configured to communicate with the data acquisition system 16 and the host computer 15 of the MR imaging apparatus 1. However, in other examples, image determination apparatus 100 can also be provided independent from MR imaging apparatus 1 and be provided in the form of, for instance, one or more computing units.

It should be noted that of course the fat suppressed diffusion image determination apparatus 100 can, in this example, rely on standard or available processing methods known in the art of MRI as exemplified above, which are, for instance, implemented in reconstruction processor 17, data acquisition system 16 and/or host computer 15, without any need for particularly and explicitly describing these methods with respect to the fat suppressed diffusion image determination apparatus 100 itself.

The fat suppressed diffusion image determination apparatus 100 comprises a diffusion reference image providing unit 110 for providing a diffusion reference MR image of the object 10, a fat image determination unit 120 for determining a fat image from the diffusion reference MR image, a diffusion weighted image providing unit 130 for providing a diffusion weighted MR image of the object, and a fat suppressed image determination unit 140 for determining a fat suppressed diffusion weighted MR image using a combination of the diffusion weighted MR image and the fat image.

The diffusion reference image providing unit 110 is configured to provide a diffusion reference MR image from storage or through acquisition by MR imaging apparatus 1, wherein the diffusion reference image providing unit 110 can be configured to control the operation of the relevant units of the MR imaging apparatus 1 for this purpose. The diffusion reference MR image can in one example be a non-diffusion weighted or b=0 image, i.e. an image with the diffusion coefficient b being equal to 0. In other examples, the diffusion reference MR image can also have a low or rather insignificant diffusion parameter b, for instance not above 200 s/mm$^2$.

The b-value is a factor that reflects the strength and timing of the gradients used to generate diffusion-weighted images. The higher the b-value, the stronger the diffusion effects, wherein the term "b-value" is widely accepted and originates from Stejskal et al. "Spin diffusion measurements: spin echoes in the presence of time-dependent field gradient." J Chem Phys 1965; 42(1):288-292, in which the pulsed gradient diffusion method as an example for DWI pulse sequences is described. In essence, the method and substantially all current DWI pulse sequences relies on two strong gradient pulses, wherein the b-value depends on the strength, duration, and spacing of these pulsed gradients. A larger b-value is achieved with increasing the gradient amplitude and duration and by widening the interval between gradient pulses. A value of b=0 is considered to represent an image without diffusion weighting.

The diffusion weighted image providing unit 130 then provides a diffusion weighted MR image of the object 10, wherein the acquisition underlying the provided MR image is preferentially similar to the acquisition of the diffusion reference MR image despite the differing b-value, i.e. the diffusion weighting. The fat suppressed image determination unit 140 then determines the fat suppressed diffusion weighted MR image using a combination of the diffusion weighted MR image, i.e. the image provided by diffusion weighted image providing unit 130, and the fat image, i.e. the fat image separated from the diffusion reference MR image, determined by the fat image determination unit 120 as detailed below.

The invention is built on the insight that fat has a very low diffusivity and that thus a fat image, i.e. an image substantially only indicative of fat, obtained from the b=0 or low b-value, i.e. diffusion suppressed, image can be employed in determining a fat suppressed diffusion weighted MR image, i.e. an image with b>>0, as will be detailed in the following.

The fat image determination unit 120 is in this examples configured to separate fat from water based on the provided diffusion reference MR image of the object 10. Multiple approaches to separating fat from water are known in the art of MRI. In this example, it is preferred that the diffusion reference MR image be in the form of a multi-shot acquired EPI image, wherein the fat image is reconstructed using a field map for water/fat candidate selection. The need for multi TE acquisitions, in particular for the acquisition of one or more diffusion weighted MR images, can thus be alleviated.

Preferably, the diffusion reference MR image is a multi-shot EPI image, of which a combination of the multiple shots is reconstructed to complex valued image data.

The EPI image is preferably acquired using multiple shots in the form of a (partial) parallel imaging (PPI), wherein the fat image is then further preferentially reconstructed based on the combined multi-shot acquisition without the application of the in-plane undersampling reconstruction, e.g. using SENSE or any other employed PPI model. As an alternative to the reconstruction using the field map, the SENSE water and fat image separation according to Larkman et al. (ISMRM 2005, 505) can be employed on the combined multi-shot EPI acquisition.

The multiple shots of the diffusion reference MR image preferably cover the entire k-space, wherein each shot has the same k-space trajectory, apart from a shift in phase encoding direction, as those acquired for the diffusion weighted MR image, i.e. with b>0. Thereby, it can be assured that geometric deformation in each shot is the same.

A SENSE reduction factor of the provided diffusion reference MR image, likewise of the diffusion weighted MR images to be described in the following, can be integer of not. In case of a non-integer SENSE factor, it is preferred to reconstruct with SENSE according to Larkman's method described above, wherein preferentially multiple averages of the diffusion reference MR image are added to reduce potential g-factor penalty in the fat image. A different preferred approach is to increase the FOV and SENSE factor with the same factor until the resulting SENSE factor is an integer.

In summary, fat image determination unit 120 determines the fat image from the diffusion reference MR image preferably by employing a parallel imaging approach to unfold water and fat signals on the basis of the chemical shift induced displacement between water and fat, which is known a priori. Both the fat image and the diffusion reference MR image are preferably provided as complex valued images to provide phase sensitivity.

The processing can be summarized and expressed in one example using a generic formula.

$$P = \begin{pmatrix} W_{b=0} \\ F_{b=0} \end{pmatrix} = \underline{H}_{b=0} \cdot \underline{m}_{b=0}$$

Two images—Water (W) and Fat (F)—are determined from a measured or acquired (folded) signal $\underline{m}$ for the b=0 acquisition and a combination matrix H.

Next, $\underline{m}$ is provided or acquired for the targeted b-factor b=B as the diffusion weighted MR image, $$\underline{m}_{b=B}.$$

The fat suppressed image determination unit subtracts the folded fat signal $$\underline{m}^F_{b=B} = S_F \cdot F_{b=0}$$

to obtain a water only (folded) diffusion weighted MR image $$\underline{m}^W_{b=B}.$$

The water only, i.e. fat suppressed, diffusion weighted MR data can then be unfolded using $$P_W = \underline{H}_{b=B} \cdot \underline{m}_{b=B}^W.$$

Using the water only signal processing prevents ill-conditioning of the reconstruction problem and further prevents the need for extension of the acquisition with phase navigators, as required for instance by the DIXON approach discussed in Burakiewicz et al. (DOI: 10.1002/mrm.25191, 2014).

Figure 2:
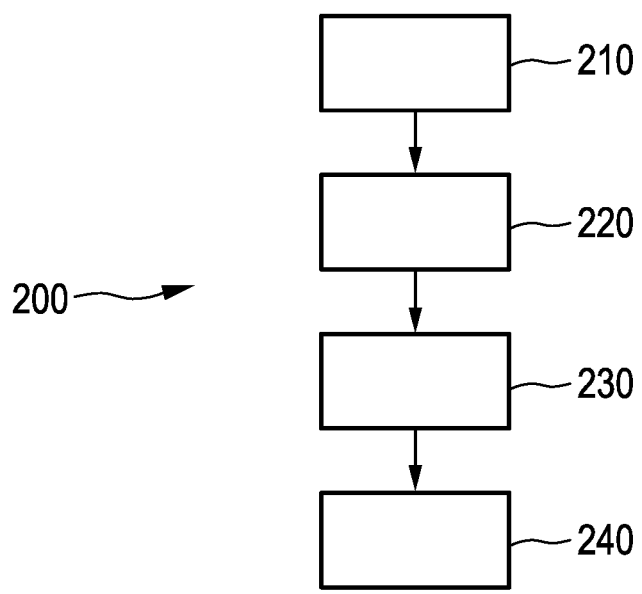
FIG. 2 shows schematically and exemplarily a flowchart of a fat suppressed diffusion image determination method according to the invention.

FIG. 2 shows schematically and exemplarily a flowchart of a fat suppressed diffusion image determination method 200 according to the invention.

The fat suppressed diffusion image determination method 200 is a method for determining a diffusion weighted magnetic resonance image (DWI) of an object 10 and comprises the following steps.

In a step 210, a diffusion reference MR image of the object 10 is determined. The diffusion reference MR image of the object is, for instance, determined by diffusion reference image providing unit 110 as described above. Preferentially, the diffusion reference MR image is a multi-shot EPI image, which is reconstructed to complex valued image data.

In a step 220, a fat image is determined from the diffusion reference MR image provided in step 210. The fat image is, for instance, determined by fat image determination unit 120 as described above. Preferentially, the diffusion reference MR image is obtained with a particular reduction factor and to determine an unfolded, complex valued fat image therefrom, SENSE unfolding is applied with water and fat in different locations in the forward model knowing the "water-fat shift" from timing parameters of the EPI acquisition. The unfolded fat image so generated is then forward folded with the applied reduction factor to determine the fat image.

In a step 230, a diffusion weighted MR image of the object 10 is determined. The diffusion weighted MR image is, for instance, determined by diffusion weighted image providing unit 130 as described above. Preferentially, the acquisition of the diffusion weighted MR image differs from the acquisition of the diffusion reference MR image in the diffusion encoding or weighting and number of shots, and the diffusion weighted MR image is provided as a folded, complex valued EPI reconstructed image. In practice, multiple diffusion weighted MR images with different diffusion parameters b will be provided.

Finally, in a step 240, a fat suppressed diffusion weighted MR image is determined using a combination of the diffusion weighted MR image provided in step 230 and the fat image determined in step 220. The fat suppressed diffusion weighted MR image is, for instance, determined by fat suppressed image determination unit 140 as described above. Preferentially, the fat image is subtracted from the diffusion weighted MR image. It can be beneficial to employ a scaling parameter, which will optimize the result of the subtraction by accounting for small signal changes in the fat signal. Advantageously, an automatic determination could be done by identifying fat signal shifted relative to the anatomy and not overlapping with anatomy. Based on the result of the subtraction, since the fat image has been removed from the diffusion weighted MR image, the residual diffusion-encoded water signal is reconstructed using SENSE. This can also be referred to as a water only unfolding.

The invention enables to achieve a fat suppressed diffusion weighted MR image with minimal impact on g-factor behaviour and scan time compared to a standard diffusion scan.

The order of steps is not limited to the order shown in FIG. 2 and, for instance, step 230 can be performed prior to step 220, i.e. the diffusion weighted MR image can be provided before the fat image is determined based on the diffusion reference image.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit, component or device may fulfill the functions of several items recited in the claims. The mere fact that certain measures are recited in mutually different dependent claims does not indicate that a combination of these measures cannot be used to advantage.

The invention claimed is:

1. An apparatus, comprising:
a diffusion reference image providing unit for providing a diffusion reference magnetic resonance (MR) image of an object using a parallel imaging method,
wherein the diffusion reference image providing unit is configured to provide a folded representation of the diffusion reference MR image of the object,
a fat image determination unit for determining a fat image from the diffusion reference MR image,
wherein the fat image determination unit is configured to determine an unfolded fat image by decomposing fat and water from the folded representation of the diffusion reference MR image, and to determine a folded representation of the decomposed fat components as the fat image,
a diffusion weighted image providing unit for providing a diffusion weighted MR image of the object, and
a fat suppressed image determination unit for determining a fat suppressed diffusion weighted MR image using a combination of the diffusion weighted MR image and the fat image.

2. The apparatus of claim 1, wherein the diffusion reference image providing unit is configured to provide the diffusion reference MR image acquired with a diffusion parameter of at most 50 s/mm².

3. The apparatus of claim 1, wherein the diffusion weighted image providing unit is configured to provide a plurality of diffusion weighted MR images of the object with respective different diffusion parameters, wherein the fat suppressed image determination unit is configured to provide a plurality of fat suppressed diffusion weighted MR images for each of the plurality of diffusion weighted MR images, using the fat image.

4. The apparatus of claim 1, wherein the diffusion weighted image providing unit is configured to provide the MR images using a parallel imaging method.

5. The apparatus of claim 4, wherein the parallel imaging method comprises SENSE.

6. The apparatus of claim 1, wherein the fat image determination unit is configured to determine a complex valued fat image and wherein the diffusion reference image providing unit is configured to provide a complex valued diffusion reference MR image.

7. The apparatus of claim 1, wherein the diffusion reference image providing unit is configured to provide the diffusion reference MR image using multiple shots for covering the entire k-space, wherein the multiple shots have similar k-space trajectories, respectively, wherein the k-space trajectories of the multiple shots have a respectively different shift in phase encoding direction.

8. The apparatus of claim 7, wherein the diffusion reference image providing unit is configured to perform an echo planar imaging reconstruction to complex valued image data, wherein the fat image determination unit is configured to determine the fat image using a SENSE separation of water and fat using the echo planar imaging reconstructed complex valued image data.

9. The apparatus of claim 8, wherein the diffusion reference image providing unit is configured to provide the diffusion reference image with a particular SENSE reduction factor.

10. The apparatus of claim 9, wherein the fat image determination unit is configured to add multiple averages of the diffusion reference image to the fat image.

11. The apparatus of claim 1, wherein the diffusion weighted image providing unit is configured to provide the diffusion weighted MR image before unfolding, wherein the fat suppressed image determination unit is configured to subtract the fat image from the folded diffusion weighted MR image and to determine the fat suppressed diffusion weighted MR image by unfolding the fat image subtracted folded diffusion weighted MR image.

12. The apparatus of claim 1, further comprising a magnetic resonance scanner configured to acquire the diffusion reference MR image and the diffusion weighted MR image of the object.

13. A method, comprising:
providing a diffusion reference magnetic resonance (MR) image of an object using a parallel imaging method,
providing a folded representation of the diffusion reference MR image of the object,
determining a fat image from the diffusion reference MR image,
determining an unfolded fat image by decomposing fat and water from the folded representation of the diffusion reference MR image,
determining a folded representation of the decomposed fat components as the fat image,
providing a diffusion weighted MR image of the object, and
determining a fat suppressed diffusion weighted MR image using a combination of the diffusion weighted MR image and the fat image.

14. A non-transitory computer readable medium configured to store program such that when the program code is executed by a magnetic resonance (MR) imaging apparatus, the MR imaging apparatus carries out a method comprising:
providing a diffusion reference MR image of an object using a parallel imaging method,
providing a folded representation of the diffusion reference MR image of the object,
determining a fat image from the diffusion reference MR image,
determining an unfolded fat image by decomposing fat and water from the folded representation of the diffusion reference MR image,
determining a folded representation of the decomposed fat components as the fat image,
providing a diffusion weighted MR image of the object, and
determining a fat suppressed diffusion weighted MR image using a combination of the diffusion weighted MR image and the fat image.

15. The method of claim 13, comprising:
providing a plurality of diffusion weighted MR images of the object with respective different diffusion parameters, and
providing a plurality of fat suppressed diffusion weighted MR images for each of the plurality of diffusion weighted MR images, using the fat image.

16. The method of claim 13, comprising determining a complex valued fat image and providing a complex valued diffusion reference MR image.

17. The method of claim 13, comprising providing the diffusion reference MR image using multiple shots for covering the entire k-space, wherein the multiple shots have similar k-space trajectories, respectively, wherein the k-space trajectories of the multiple shots have a respectively different shift in phase encoding direction.

18. The apparatus of claim 1, wherein the diffusion reference image providing unit is configured to provide the diffusion reference MR image acquired with a diffusion parameter of at most 200 s/mm$^2$.

19. The apparatus of claim 1, wherein the diffusion weighted image providing unit is configured to provide the diffusion weighted MR image acquired with a diffusion parameter greater than 1000 s/mm$^2$.

20. The apparatus of claim 1, wherein the diffusion weighted image providing unit is configured to provide the diffusion weighted MR image acquired with a diffusion parameter greater than 100 s/mm$^2$.

* * * * *